United States Patent
Danmayr et al.

(10) Patent No.: US 12,085,615 B2
(45) Date of Patent: Sep. 10, 2024

(54) METHOD AND ARRANGEMENT FOR PERFORMING A SHUTDOWN TEST ON AN INVERTER

(71) Applicant: Fronius International GmbH, Pettenbach (AT)

(72) Inventors: Joachim Danmayr, Pettenbach (AT); Christian Kasberger, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 801 days.

(21) Appl. No.: 17/278,960

(22) PCT Filed: Sep. 24, 2019

(86) PCT No.: PCT/EP2019/075724
§ 371 (c)(1),
(2) Date: Mar. 23, 2021

(87) PCT Pub. No.: WO2020/064740
PCT Pub. Date: Apr. 2, 2020

(65) Prior Publication Data
US 2022/0011365 A1    Jan. 13, 2022

(30) Foreign Application Priority Data
Sep. 28, 2018 (EP) .................................... 18197403

(51) Int. Cl.
*G01R 31/327* (2006.01)
*G01R 19/165* (2006.01)
*G01R 31/42* (2006.01)

(52) U.S. Cl.
CPC ... *G01R 31/3275* (2013.01); *G01R 19/16547* (2013.01); *G01R 31/42* (2013.01)

(58) Field of Classification Search
None
See application file for complete search history.

(56) References Cited

U.S. PATENT DOCUMENTS

2013/0300423 A1  11/2013  Klapper
2015/0288191 A1  10/2015  Aitzetmueller et al.
(Continued)

FOREIGN PATENT DOCUMENTS

CN    101118275    2/2008
CN    103389460    11/2013
(Continued)

OTHER PUBLICATIONS

Int'l Search Report (Form PCT/ISA/210) conduced in Int'l Appln. No. PCT/EP2019/075724 (Nov. 5, 2019).
(Continued)

*Primary Examiner* — Walter L Lindsay, Jr.
*Assistant Examiner* — Geoffrey T Evans
(74) *Attorney, Agent, or Firm* — GREENBLUM & BERNSTEIN, P.L.C.

(57) ABSTRACT

In order to be able to perform a shutdown test on an inverter with little expenditure, a trigger signal is modulated to the AC current or the AC voltage at a first moment, and the inverter is used at a second moment, which occurs a defined duration after the start of the trigger signal at the first moment, to generate an AC current or an AC voltage with a fault signal that is detected by the inverter and which triggers a shutdown of the inverter, and the shutdown moment of the AC current or the AC voltage is determined. A shutdown duration of the inverter is determined from the difference between the shutdown moment and the second moment.

10 Claims, 3 Drawing Sheets

(56) References Cited

U.S. PATENT DOCUMENTS

Figure 1:
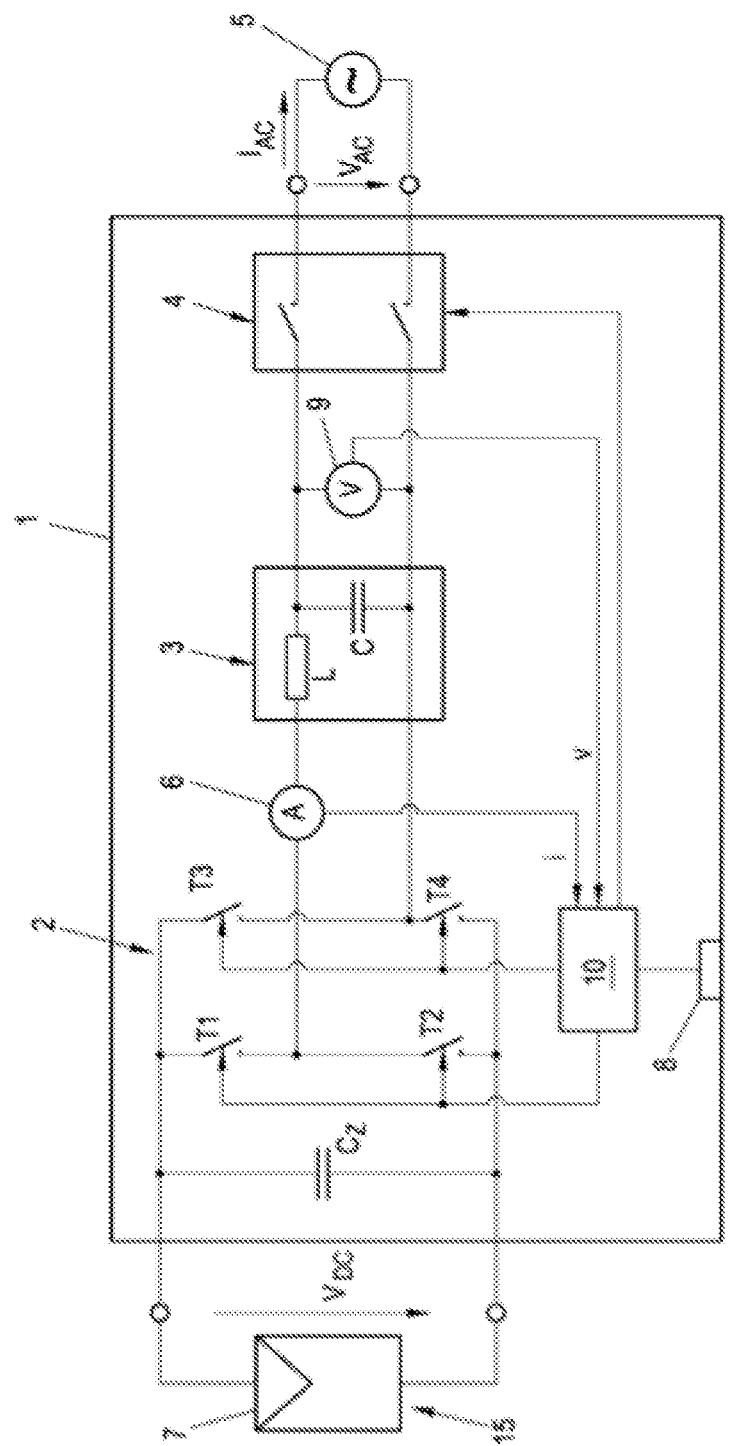

2016/0314928 A1    10/2016  Niehoff
2018/0164367 A1     6/2018  Zheng et al.
2019/0363533 A1*   11/2019  Schierling .............. G01R 31/52

FOREIGN PATENT DOCUMENTS

| CN | 104782015 | 7/2015 |
| CN | 105182229 | 12/2015 |
| CN | 106291147 | 1/2017 |
| EP | 2 662 697 | 11/2013 |
| JP | H08-94679 | 4/1996 |
| WO | 2014/075999 | 5/2014 |

OTHER PUBLICATIONS

Int'l Written Opinion (Form PCT/ISA/237) conduced in Int'l Appln. No. PCT/EP2019/075724 (Nov. 5, 2019).
China Office Action/Search Report conducted in China Appln. No. 201980063348.6 (Apr. 20, 2022) (w. translation).

* cited by examiner

METHOD AND ARRANGEMENT FOR PERFORMING A SHUTDOWN TEST ON AN INVERTER

The present invention relates to a method for performing a shutdown test on an inverter which generates an AC current and an AC voltage at the output. The invention also relates to an arrangement for performing a shutdown test on an inverter, having a control unit which controls a switching arrangement of the inverter for generating an AC current and an AC voltage at the output.

Inverters are used to connect an electrical energy source to an electrical utility grid for feeding into said grid. In the case of bidirectional inverters, they are also used to charge an electrical energy storage device from the energy source or from the utility grid. In the case of emergency power-capable inverters, they can also make the stored energy available to consumers without a utility grid. The electrical energy source is, for example, a photovoltaic system or one or more photovoltaic cells. The electrical energy source can, however, also be a wind turbine, a battery or the like. Such inverters connected to a utility grid are subject to strict regulations, for example by national grid operators or by national legislation. In order for an inverter to be approved for grid operation, such an inverter must go through various test procedures. Many of these tests aim to ensure that the inverter has to terminate feed-in operations and/or disconnect itself from the utility grid after a defined maximum time following the occurrence of a fault. Thus, the inverter has implemented monitoring functions for detecting and evaluating various fault signals and, if necessary, for disconnecting the inverter from the utility grid or the consumers. During the approval tests to be performed, a fault signal is applied to the output of the inverter, which is to be detected by the inverter. Usually, the shutdown duration and the measured value at which the inverter disconnects itself from the utility grid, or at which it terminated the feed-in operation, are to be determined. This is intended to verify the maximum shutdown duration specified in the test standard. One problem in this context is that of determining the moment at which the fault signal was applied, in order to be able to precisely determine the time elapsed from application to shutdown.

So far, the inverter, issued a trigger signal at a trigger output as soon as the fault signal was provided. The trigger signal could then be sensed in order to determine the shutdown duration proceeding from said trigger signal. However, the trigger output is only accessible internally, as this output is not required in normal operation. This means that the inverter has to be opened to pick up the trigger signal, which is problematic due to the high voltages in the inverter and represents a safety risk. As the trigger signal is very time-critical, I/Os that are positioned very close to the hardware are required for picking up this signal, which then usually carries dangerous electrical potential (voltages greater than the safety extra low voltage of 50V) or are in the vicinity of dangerous electrical potential, which is also problematic when performing shutdown tests because appropriate safety precautions must be taken. In addition, a separate trigger output must be provided on the hardware of the inverter, which of course makes the circuit more complex and expensive.

Another known method is to use a high resolution oscilloscope to record the relevant signals. However, with very small changes in voltage or current, it is a considerable problem to set a correct trigger due to the measurement resolution. This often required the use of very high quality oscilloscopes, which in turn makes testing expensive.

A problem addressed by the invention is therefore that of specifying an arrangement and a method by means of which an exact triggering of the moment of the occurrence of the fault can be determined for a shutdown test on an inverter without additional hardware or without additional expensive measuring means, in order to enable the shutdown duration to be determined easily.

According to the invention, this problem is solved by a method according to claim 1 and an arrangement according to claim 5.

After the shutdown test has started at the first moment, a defined period of time is allowed to expire before the fault signal is applied. However, the trigger signal can be used to determine the first moment precisely and unambiguously. After the duration is known, the second moment at which the output of the fault signal is started can also be clearly established. The shutdown moment can also be clearly identified as the moment at which the AC current or the AC voltage is zero or substantially zero. With this procedure, the shutdown duration, that is to say, the time that elapses between the start of the fault signal and the shutdown, can thus be determined clearly and simply as the result of the shutdown test. Therein, the shutdown can be performed in any manner, for example by opening disconnection points in the inverter and/or by terminating the generation of an AC current/AC voltage. The shutdown can also be triggered in any manner, for example by the control unit of the inverter.

The AC current generated by the inverter or the AC voltage generated by the inverter is preferably measured and evaluated in order to determine the first moment and/or the shutdown moment. This allows the shutdown test to be performed automatically, which simplifies the shutdown test.

A further simplification, in particular in the determination of the different moments, is achieved if the first moment and/or the second moment are synchronized to a zero crossing of the AC current or the AC voltage.

In a simple embodiment, the evaluation unit can be designed as an oscilloscope that records the AC current or the AC voltage, from which the first moment and/or the shutdown moment can be determined.

Figure 2:
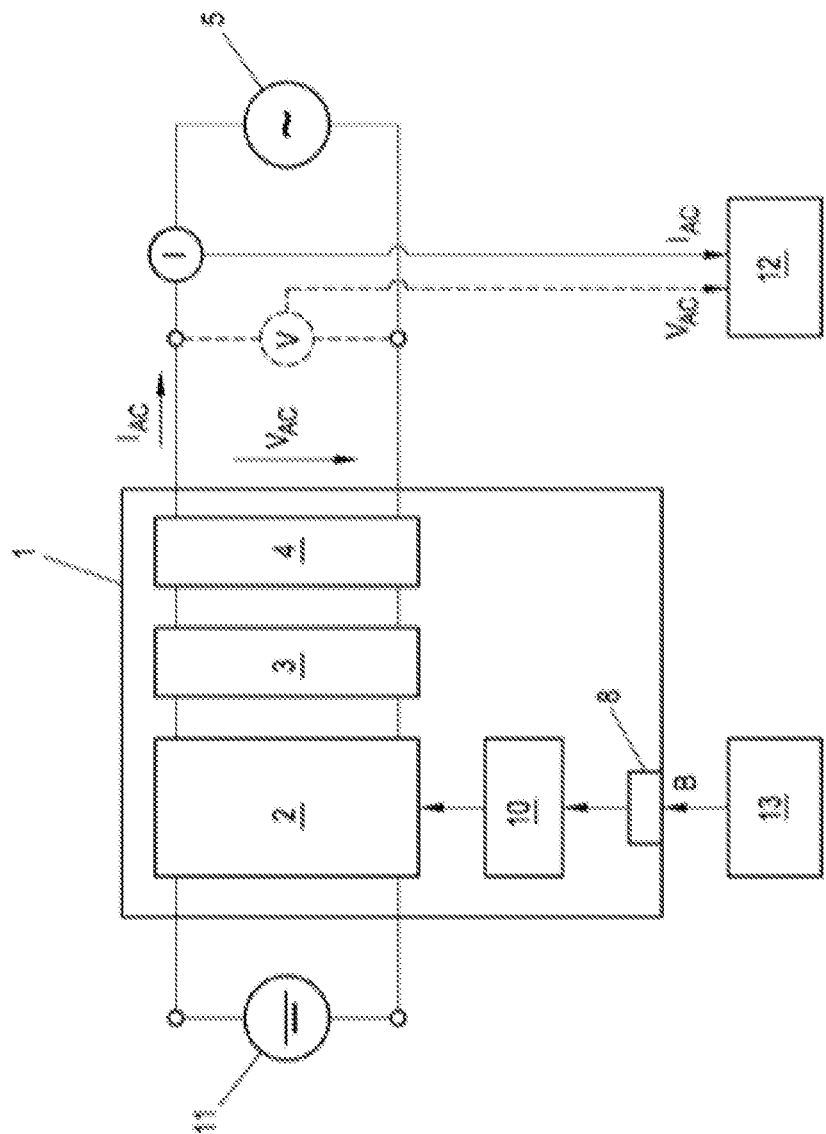
Figure 3:
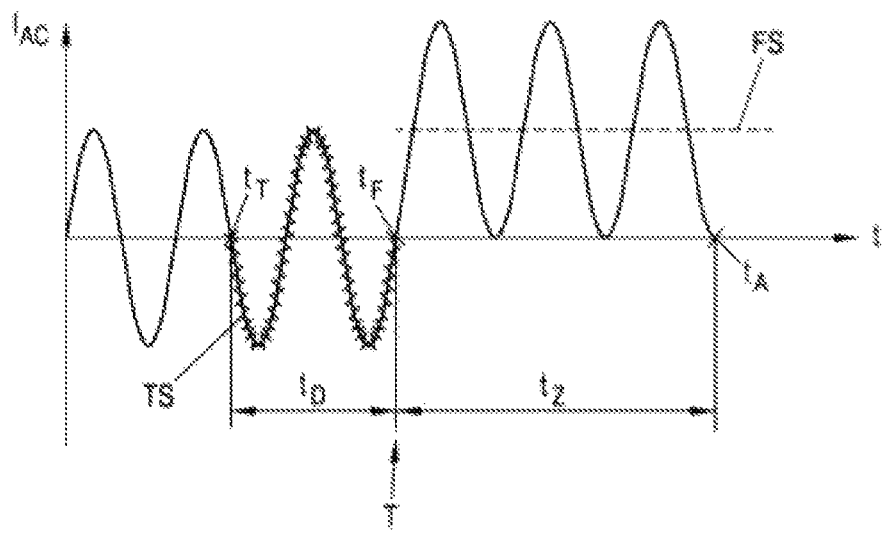
Figure 4:
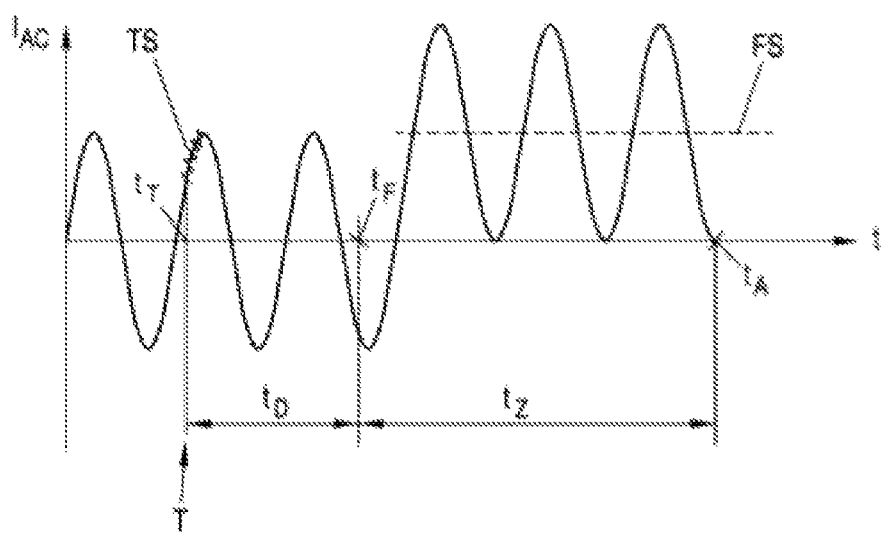

The present invention is described in greater detail below with reference to FIGS. 1 to 4, which show exemplary, schematic and non-limiting advantageous embodiments of the invention. In the drawings FIG. 1 shows an embodiment of an inverter, FIG. 2 shows a possible arrangement for performing a shutdown test on an inverter, and FIGS. 3 and 4 show possible embodiments for triggering the fault signal.

FIG. 1 shows an example of a single-phase inverter 1 with a DC voltage side with terminals for a DC voltage $V_{DC}$ and an AC voltage side with terminals for an AC voltage $V_{AC}$. A DC voltage source as an electrical energy source 15, for example at least one photovoltaic module 7, is connected to the terminals for a DC voltage $V_{DC}$, and the inverter 1 is connected to an electrical utility grid 5 or to another electrical consumer via the terminals for an AC voltage $V_{AC}$.

A DC voltage intermediate circuit capacitor $C_Z$ is usually connected in parallel to the terminals for the DC voltage $V_{DC}$ for smoothing and stabilizing the DC voltage $V_{DC}$. On the AC voltage side, a disconnection point 4, for example with a disconnection relay, can be provided upstream of the terminals for the AC voltage $V_{AC}$, in order to be able to disconnect the inverter 1 from the utility grid 5. An output filter 3, for example with a filter choke L and a filter capacitor C, can be connected upstream of the disconnection point 4 in order to smooth the generated AC voltage $V_{AC}$. A disconnection point can also be provided on the DC voltage side. The DC voltage side of the inverter 1 is connected to the AC voltage side via a switching arrangement 2, for example a bridge circuit with semiconductor switches T1, T2, T3, T4. By switching the semiconductor switches T1, T2, T3, T4 of the switching arrangement 2 in a clocked manner, the desired AC voltage is generated in a known manner with regards to frequency, amplitude and phase. The inverter 1 is usually synchronized to the line voltage in the utility grid 5.

The inverter 1 can also have a multi-phase design, wherein the switching arrangement 2 and optionally the output filter 3 and the disconnection point 4 are provided for each phase or a corresponding topology of the switching arrangement 2 is used.

Each inverter 1 also has a control unit 10 (hardware and software) for properly controlling the semiconductor switches T1, T2, T3, T4 of the switching arrangement 2. The control unit 10 also controls the disconnection point 4, which is located on the DC-voltage and/or AC voltage side, in order to terminate the generation of the AC voltage $V_{AC}$ or, analogously, of the AC current $I_{AC}$, or to disconnect the inverter 1 from the utility grid 5. The inverter 1 usually also has an input/output interface 8, for example in order to receive external control commands. To control the inverter 1, a voltage measuring unit 9 and a current measuring unit 6 are usually also provided on the AC voltage side at a suitable point. The measured values are processed in the control unit 10 for controlling the inverter 1. A voltage measuring device for measuring the intermediate circuit voltage, which can also be processed in the control unit 10, can also be provided on the DC voltage side.

It should be noted, however, that there are also other topologies of inverters 1, for example with galvanic separation of the DC voltage side and the AC voltage side by means of a transformer or with a differently designed switching arrangement 2. This fact is irrelevant for the present invention. The embodiment of FIG. 1 serves only to explain the invention.

To perform shutdown tests on the inverter 1, it is usually supplied with electrical energy from a DC voltage source 11 in the laboratory environment and connected to a utility grid 5 or to another electrical consumer, as shown in FIG. 2. On the output side, the AC current $I_{AC}$, or also the AC voltage $V_{AC}$ (as indicated by dashed lines), is measured and evaluated in an evaluation unit 12 (hardware and/or software). The inverter 1 receives the command B to perform a shutdown test from a test control unit 13 via the input/output interface 8. The way in which command B is given of course depends on the implementation of the inverter 1 and the input/output interface 8; however, this is irrelevant for the present invention. For example, the input/output interface 8 can be implemented as a bus interface to a data communication bus, such as a CAN bus or Ethernet. In this case, the command B is sent to the inverter 1 as a bus message, for example. The evaluation unit 12 and the test control unit 13 can also be implemented on the same hardware. However, it can also be provided that a shutdown test can be selected directly at the input/output interface 8, for example a touchscreen with corresponding menu design, and the command B is given directly at the input/output interface 8, for example by a user. In this case, it can also be provided that the user can only access the menu for the shutdown test by entering a secret security code or pressing a secret key combination, or the like, such that this functionality is not accessible during normal operation.

Command B can also be used to transmit the type of shutdown test. For example, the shutdown test can be performed to detect a DC component in the AC current $I_{AC}$ as a fault signal. The value of the fault signal to be set, for example the value of the DC component, can also be transmitted with the command. Other typical shutdown tests are overvoltage, overfrequency/underfrequency, identified stand-alone networks, electric arcs, etc. The fault signal and the AC current $I_{AC}$ are generated by the switching arrangement 2, by controlling the switching arrangement 2 via the control unit 10 in a suitable manner. A safety function is implemented in the inverter 1, preferably in the control unit 10 or a separate safety unit, which evaluates the AC current $I_{AC}$, or also the AC voltage $V_{AC}$, for possible fault signals, for example based on the voltage v measured in the inverter 1 and/or the measured current i. If a fault signal is detected, the inverter 1 must automatically disconnect itself from the utility grid 5, for example by means of the disconnection point 4 or a disconnection point on the DC voltage side, or terminate the generation of the AC voltage $V_{AC}$/the AC current $I_{AC}$.

A test routine is implemented in the control unit 10, for example as software on a control unit hardware, which is started when command B is received. Before generating the fault signal, the test routine now generates a trigger signal TS modulated to the AC current $I_{AC}$ or the AC voltage $V_{AC}$, with a predetermined frequency and amplitude. The frequency can be a maximum of half the clock frequency (typically in the range greater than 20 kHz) of the switching arrangement 2. The trigger signal TS should of course be easily and clearly identifiable and should influence the utility grid 5 as little as possible. For example, the trigger signal TS is an alternating signal with a frequency in the range from a hundred to a thousand times the network frequency, for example a frequency of 1 kHz, with an amplitude in the range of tenths of the amplitude of the alternating current $I_{AC}$, for example 0.3 A-0.5 A, or in the range of hundredths of the amplitude of the AC voltage $V_{AC}$, for example 3 V-10 V at 230 V mains voltage. Such a trigger signal can easily be detected in the AC current $I_{AC}$, or in the AC voltage $V_{AC}$, both by measuring and evaluating, but also on a simple oscilloscope without any special resolution requirements. The trigger signal TS is preferably synchronized to the AC current $I_{AC}$, or the AC voltage $V_{AC}$, such that the trigger signal begins, for example, at a zero crossing of the AC current $I_{AC}$, or the AC voltage $V_{AC}$, and lasts for a certain period, for example x half-cycles of the AC current $I_{AC}$ or the AC voltage $V_{AC}$, with x≥1. The trigger signal TS does not necessarily have to be synchronized, but can in principle begin at any time and last for a predefined time.

The trigger signal TS is generated by appropriate control of the switching arrangement 2 by the control unit 10 and is used to announce the subsequent fault signal FS. The time measurement up to the start of the fault signal FS can be based on the start of the trigger signal TS as well as on the end of the trigger signal TS. If the trigger signal TS has a defined duration, then the end of the trigger signal TS is preferably used as the trigger T for the fault signal FS. However, if the trigger signal TS does not have a defined duration, for example if a pulse without a defined end is switched onto the AC voltage $V_{AC}$ as the trigger signal TS, then the beginning of the trigger signal TS is preferably used as the trigger T for the fault signal FS, and the fault signal FS is started after a defined duration $t_D \geq 0$ after the trigger T.

The fault signal FS thus begins a defined period of time $t_D$ after the trigger T by the trigger signal TS. Both methods are of course equivalent.

This is shown by way of example in FIG. 3, using the example of the AC current $I_{AC}$ (AC voltage $V_{AC}$ is of course analog). Up to a moment $t_T$, the AC current $I_{AC}$ generated by the inverter 1, which is fed into the utility grid 5, is applied to the output. At the first moment $t_T$ at a zero crossing of the AC current $I_{AC}$, a trigger signal TS is modulated to the AC current $I_{AC}$, here, for example, an AC signal with 1 kHz and 0.5 A and a predetermined duration $t_D$ of three half-cycles. The trigger T for the fault signal FS is thus set three half-cycles after the moment $t_T$ at the second moment $t_F$. The fault signal FS, for example a DC component in the AC current $I_{AC}$ (as in FIG. 3), or, for example, a frequency change, an amplitude change or a combination thereof, thus begins at the defined moment $t_F$ ($t_T+t_D$).

In the embodiment according to FIG. 4, a pulse is modulated to the AC current $I_{AC}$ at the first moment $t_T$. Until the moment $t_T$, the AC current $I_{AC}$ generated by the inverter 1, which is fed into the utility grid 5, thus is applied to the output. The detectable beginning of the pulse at the moment $t_T$ is used as trigger T, wherein the moment $t_T$ in this example is not synchronized to the AC current $I_{AC}$, but rather can be any moment. After a defined period of time $t_D$, the fault signal FS, for example a DC component on the AC current $I_{AC}$, begins at the defined second moment $t_F$ ($t_T+t_D$).

The time measurement starting at moment $t_F$ will now be described in detail with reference to FIGS. 3 and 4.

Accordingly, the time measurement starts with the fault signal FS at the moment $t_F$ and ends at a moment $t_A$ at which the inverter 1 was disconnected from the utility grid 5 or the consumer, or the generation of the AC current $I_{AC}$/the AC voltage $V_{AC}$ was terminated. The fault signal FS is here a DC component, by means of which, for example, a fault in a current sensor in the inverter 1 is simulated. The shutdown moment $t_A$ at which the inverter 1 at its output is disconnected from the utility grid 5, for example by opening the disconnection point 4, or at which the generation of an AC voltage $V_{AC}$/an AC current $I_{AC}$ is terminated, for example by means of the control unit 10, can be clearly established by determining from which point in time on the AC current $I_{AC}$/the AC voltage $V_{AC}$ is substantially zero. It can be tested whether the AC current $I_{AC}$ or the AC voltage $V_{AC}$ are actually permanently zero (to distinguish zero crossings), or are permanently within a narrow window, for example ±0.3 A or ±10 V, around zero. The time difference between the shutdown moment $t_A$ and the starting point of the fault signal $t_F$ then results in the shutdown duration $t_Z$ of the inverter to be checked by means of the shutdown test, which can be checked by means of the evaluation unit 12.

The moments and durations can be determined by evaluating the AC current $I_{AC}$/AC voltage $V_{AC}$ detected by means of the evaluation unit 12. For this purpose, the AC current $I_{AC}$ or the AC voltage $V_{AC}$ can be measured as in FIG. 2 and evaluated in the evaluation unit 12. The evaluation unit 12 could, however, also be designed as a conventional oscilloscope, wherein no measuring units would be required, but the AC current $I_{AC}$/the AC voltage $V_{AC}$ could be picked up directly. The shutdown test can be performed without having to open the inverter 1 or without having to adapt the inverter 1 in terms of hardware. Only the test routine needs to be implemented in the control unit 10.

The invention claimed is:

1. A method for performing a shutdown test on an inverter that generates an AC current and an AC voltage at an output, the method comprising:

using the inverter for modulating a trigger signal to the AC current or the AC voltage at a first moment, generating an AC current with a fault signal or an AC voltage with a fault signal at a second moment, which occurs a defined duration after a start of the trigger signal at the first moment, wherein the fault signal is detected by the inverter, which triggers a shutdown of the inverter, and determining a shutdown moment of the AC current or the AC voltage, and determining a shutdown duration of the inverter from a difference between the shutdown moment and the second moment.

2. The method according to claim 1, wherein the AC current generated by the inverter or the AC voltage generated by the inverter is measured and evaluated to determine the first moment and/or the shutdown moment.

3. The method according to claim 1, wherein the first moment is synchronized to a zero crossing of the AC current or the AC voltage.

4. The method according to claim 3, wherein the second moment is synchronized to a zero crossing of the AC current or the AC voltage.

5. An arrangement for performing a shutdown test on an inverter, comprising:

a control unit configured to control a switching arrangement of the inverter for generating an AC current and an AC voltage at an output and for modulating a trigger signal to the AC current or the AC voltage at a first moment, wherein, at a second moment, which occurs a defined duration after a start of the trigger signal at the first moment, the control unit controls the switching arrangement to generate an AC current with a fault signal or an AC voltage with a fault signal, wherein a safety function is implementable in the inverter to detect the fault signal, which triggers a shutdown of the inverter, and an evaluation unit configured to determine a shutdown moment of the AC current or of the AC voltage, and a shutdown duration of the inverter from a difference between the shutdown moment and the second moment.

6. The arrangement according to claim 5, further comprising a measuring device configured for measuring the AC current generated by the inverter or the AC voltage generated by the inverter, and the evaluation unit is configured to evaluate the measured AC current or the measured AC voltage for determining the first moment and/or the shutdown moment.

7. The arrangement according to claim 5, wherein the evaluation unit is designed as an oscilloscope configured to record the AC current or the AC voltage in order to determine the first moment and/or the shutdown moment.

8. An arrangement for performing a shutdown test on an inverter, comprising:

a plurality of switches operably arranged for generating an AC current and an AC voltage at an output of the inverter, and for modulating a trigger signal to the AC current or the AC voltage at a first moment, wherein, at a second moment, which occurs a defined duration after a start of the trigger signal at the first moment, the plurality of switches is operable to generate an AC current with a fault signal or an AC voltage with a fault signal, wherein a safety function is implementable in the inverter to detect the fault signal, which triggers a shutdown of the inverter, and wherein a shutdown moment of the AC current or of the AC voltage is determinable to ascertain a shutdown duration of the inverter from a difference between the shutdown moment and the second moment.

9. The arrangement according to claim 8, wherein the AC current generated by the inverter or the AC voltage generated by the inverter is measured, and the measured AC current or the measured AC voltage is evaluated for determining the first moment and/or the shutdown moment.

10. The arrangement according to claim 8, further comprising an oscilloscope configured to record the AC current or the AC voltage in order to determine the first moment and/or the shutdown moment.

\* \* \* \* \*